United States Patent [19]
Alexander

[11] Patent Number: 5,661,882
[45] Date of Patent: Sep. 2, 1997

[54] METHOD OF INTEGRATING ELECTRONIC COMPONENTS INTO ELECTRONIC CIRCUIT STRUCTURES MADE USING LTCC TAPE

[75] Inventor: John H. Alexander, Goleta, Calif.

[73] Assignee: Ferro Corporation, Cleveland, Ohio

[21] Appl. No.: 497,239

[22] Filed: Jun. 30, 1995

[51] Int. Cl.⁶ .................................................. H01G 4/12
[52] U.S. Cl. ......................... 29/25.42; 29/602.1; 29/611; 264/615; 264/616
[58] Field of Search ........................ 29/602.1, 25.42, 29/611, 612; 264/56, 57, 59, 60, 61

[56] References Cited

U.S. PATENT DOCUMENTS

| | | | |
|---|---|---|---|
| 3,679,950 | 7/1972 | Rutt | 317/258 |
| 3,879,645 | 4/1975 | Rutt et al. | 317/258 |
| 5,234,641 | 8/1993 | Rutt | 264/61 |
| 5,239,744 | 8/1993 | Fleming et al. | 29/602.1 |
| 5,258,335 | 11/1993 | Muralidhar et al. | 501/20 |
| 5,349,743 | 9/1994 | Grader et al. | 29/602.1 |

*Primary Examiner*—Carl E. Hall
*Attorney, Agent, or Firm*—Rankin, Hill, Lewis & Clark

[57] ABSTRACT

The present invention provides a method of producing a low temperature cofired electronic monolithic structure having one or more electronic components integrated therein comprising the steps of:

A. providing a green electronic component;

B. providing a stack of green low temperature cofired ceramic dielectric tape having an opening formed in the stack for receiving the green electronic component;

C. placing the green electronic component in the opening in the stack to form a structure; and D. laminating and firing the structure so as to provide the monolithic electronic structure.

8 Claims, 2 Drawing Sheets

METHOD OF INTEGRATING ELECTRONIC COMPONENTS INTO ELECTRONIC CIRCUIT STRUCTURES MADE USING LTCC TAPE

FIELD OF THE INVENTION

This invention relates to the manufacture of ceramic articles and especially to ceramic articles constructed of strips of fusible dielectric tape laminated together to form a chambered or cavitated article which houses an electronic component. More particularly, the invention relates to a method of producing ceramic articles of the type described wherein the electronic component in a green or unfired condition is placed into the cavity formed by the dielectric tape and both the tape and the green electronic component are simultaneously fired.

BACKGROUND

Various types of modules, packages or other electronic circuit structures are utilized in the electronics industry. Such modules or packages are employed in a variety of electronic devices including, for example, personal computers, communication devices, and military devices such as radar and armament control systems. Electronic circuit structures such as multi-chip module (MCM) circuit structures and multilayer circuit structures are often formed of a dielectric material such as a low temperature co-fired ceramic (LTCC) dielectric tape. Some of these structures include cavities which may be used for mounting semiconductor devices. The rest of the outer surface of the structure may be used to mount capacitors, inductors, varistors and other electronic components or devices. Such surface mounting takes a lot of room, can result in conductor lines that are too long, and can lead to reliability problems.

In the prior art, the electronic components are fully formed and fired prior to their addition to the fired LTCC dielectric tape structure or stack. It would be desirable to have a method that yielded a monolithic circuit structure wherein the dielectric tape and the electronic components are subjected to a single simultaneous firing operation.

SUMMARY OF THE INVENTION

The present invention provides a new and improved method of making an electronic circuit structure made using LTCC dielectric tape having electronic components integrated therein whereby the tape that forms the stack, and the electronic components designed for use with the structure, are subjected to a single simultaneous firing. The method of the present invention yields a monolithic electronic circuit structure that is substantially free of gaps or openings. The electronic components may comprise, for example, one or more capacitors, inductors or varistors.

In one embodiment the method includes the steps of: (i) providing a green electronic component; (ii) providing a stack of green low temperature cofired ceramic dielectric tape having an opening formed in the stack for receiving the green electronic component, (iii) placing the green electronic component in the opening in the stack to form a structure; and (iv) laminating and firing the structure so as to provide a monolithic electronic structure.

The formation of the green electronic component includes the steps of providing multiple layers of a green ceramic composition, forming a metallization on at least one of the layers of green ceramic composition, and stacking and laminating the metallized layers of green ceramic composition. A conductive termination coating may be applied along the outside of at least a portion of the laminated metallized layers of green ceramic composition to facilitate the flow of electrical current from the electronic component to the stack of LTCC dielectric tape. Alternatively, it is possible to apply the conductive termination material to the inside walls of the opening or cavity formed in the LTCC dielectric tape so as to facilitate the flow of electrical current from the electronic component to the LTCC dielectric tape.

The composition of the dielectric material and organic binder that form the low temperature cofired ceramic dielectric tape (or what is often called a "green" LTCC dielectric tape) may include a variety of glass/ceramic dielectric materials. The product is usually the result of the grinding of the respective components to a fine powder and then mixing the respective powders with the organic binder to form a paste. The paste may then be applied or cast onto a flexible film backing or substrate such as "MYLAR" to facilitate handling. The green tape may easily be removed from the MYLAR backing when one wishes to employ the green tape.

The composition of the dielectric material and the organic binder that form the green electronic component may also comprise a variety of glass/ceramic dielectric materials. The composition must be formulated such that the shrinkage on firing and the thermal coefficient of expansion match that of the LTCC dielectric tape. Once a paste is formed of the desired materials, as with the low temperature cofired ceramic dielectric tape, the paste is generally then applied onto a flexible film backing substrate such as "MYLAR" to facilitate handling. Upon curing the MYLAR backing can be removed to allow one to utilize the green ceramic composition to form the electronic component.

The foregoing and other features of the invention are hereinafter more fully described and particularly pointed out in the claims, the following description setting forth in detail certain illustrative embodiments of the invention, these being indicative, however, of but a few of the various ways in which the principles of the present invention may be employed.

DESCRIPTION OF THE PREFERRED EMBODIMENT

The invention will be described with reference to a ceramic article 10 that exemplifies the type of ceramic article that may be produced in accordance with the method of the invention. Ceramic article 10 may be utilized to form electronic circuit structures or multilayer circuit structures or packages.

Figure 1:
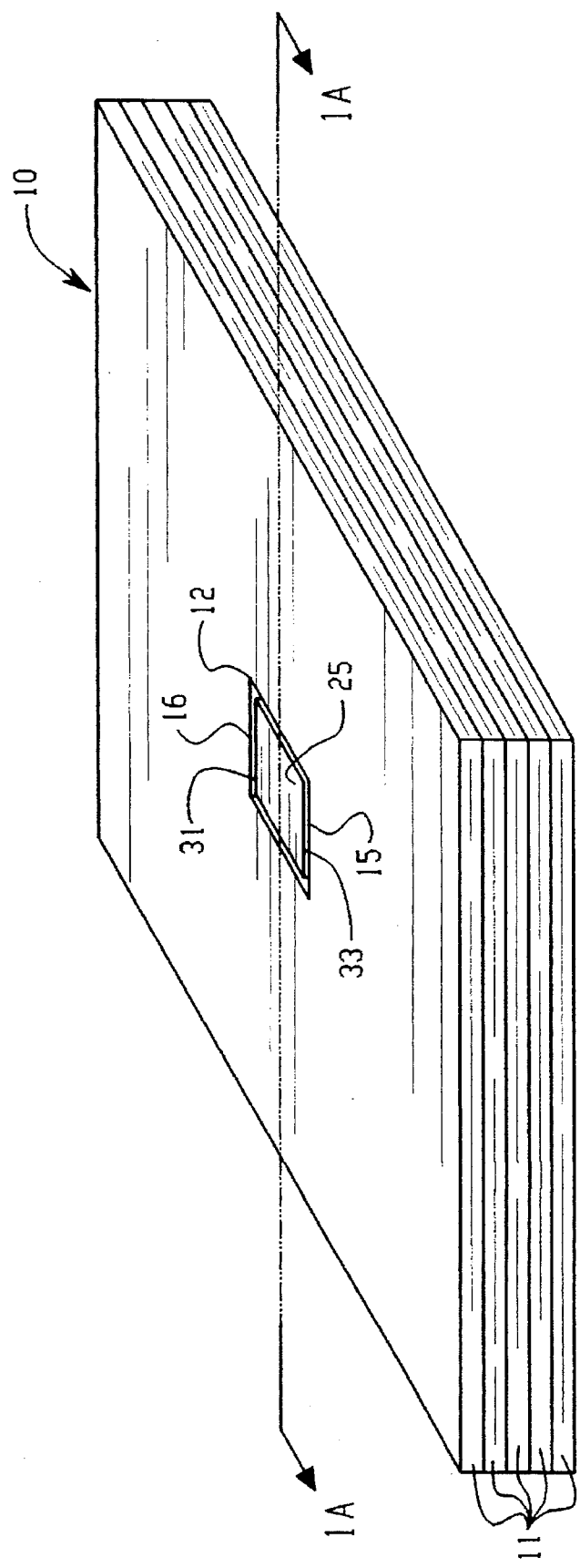
FIG. 1 is a perspective view of an electronic circuit structure prior to lamination made in accordance with the present invention.
Figure 1A:
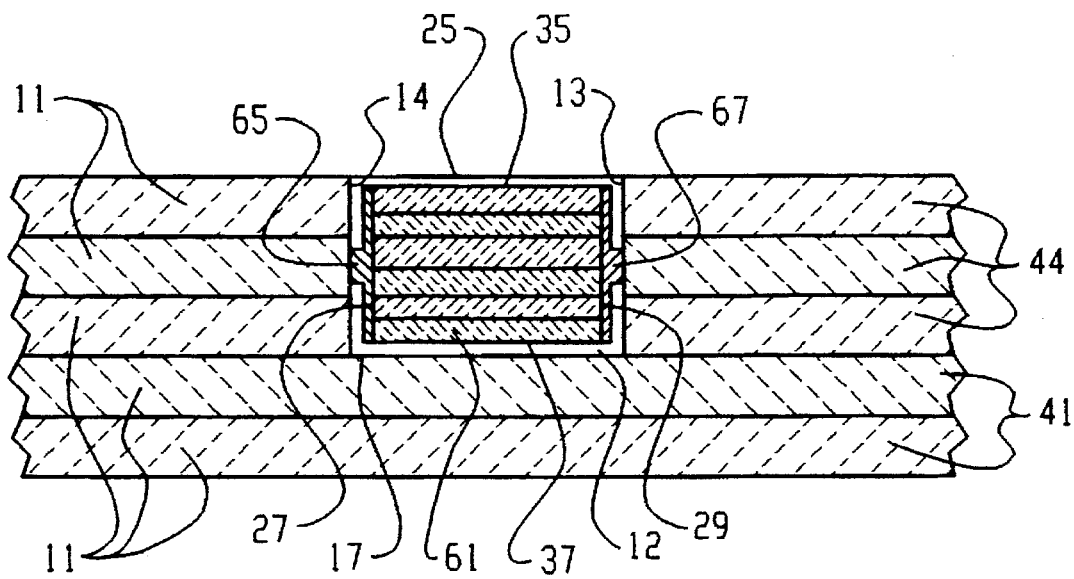
FIG. 1A is a cross-sectional view of the electronic circuit structure of FIG. 1 taken along line 1A—1A thereof.

Referring to FIGS. 1 and 1A, the article 10 includes a laminate comprising multiple layers of low temperature cofired ceramic (LTCC) dielectric tape 11 having a cavity 12 formed therein. The cavity has generally vertical side walls 13 and 14, end walls 15 and 16 and a generally rectangular floor 17. Located within cavity 12 is an electronic component 25 having side walls 27 and 29, end walls 31 and 33, a top wall 35 and a bottom wall 37.

The Process

The method of the present invention is concerned with the construction of ceramic articles formed from green LTCC dielectric tape and a green electronic component, wherein the green LTCC dielectric tape and the green electronic component are subjected to a single, simultaneous firing step.

In accordance with the method of the invention a raw or green laminate or structure is formed by assembling precut sheets of green LTCC dielectric tape 11 including base layers (indicated at 41) and cavity layers (indicated at 44) which are provided with cut-outs or openings to form the cavity 12. Depending on the nature of the electronic circuit structure being produced, one or more sides of layers 41 and 44 will include green or unfired electrical circuits (not shown) formed thereon using conventional techniques (such as screen printing) and conventional electronic materials such as conductive and dielectric thick film pastes and inks.

The glasses and fillers that are used to make the green LTCC sheet are preferably milled to about 1–10 microns average size. The binder may include a solvent, a surfactant and a plasticizer. Typical binders include acrylic compounds and polyvinyl compounds. Plasticizers may include any of the phthalates. Additionally, viscosity modifiers, anti-skinning agents and the like can be used as is well-known in the art.

The LTCC green dielectric tapes are made by casting a dispersion or slip of the solids portion in a flowable polymeric material onto a flexible substrate such as MYLAR, and then heating the cast layer to remove any volatile solvents. Drying the dispersion or slip yields a cast layer comprising the solids portion dispersed in the polymeric material. After drying, the cast layer can then be carefully separated from the flexible substrate. The tape can then be cut to size, printed with the necessary electrical circuits (not shown) and then stacked.

As to the particular composition of the glasses, fillers and binders utilized to produce the LTCC green dielectric tape, it will be appreciated that many alternatives may be selected to satisfy different applications of the invention, such as, for example, the firing temperature and time of the ceramic structure, the end application for the ceramic structure, and the type of circuits formed on the LTCC dielectric tape.

U.S. Pat. No. 5,258,335 to Muralidhar et al. discloses a method of producing a low temperature cofired ceramic (LTCC) dielectric green tape. The '335 patent is incorporated herein by reference for its teachings of how to make a low temperature cofired ceramic dielectric green tape.

Various LTCC dielectric green tape products are commercially available. One example of a commercially available LTCC dielectric green tape product is a tape sold under the trade designation A-6 by the Ferro Corporation of Cleveland, Ohio. Another example of a commercially available LTCC green dielectric tape is DuPont tape sold under the trade designation 851AT.

The green electronic component 25 is formed in a similar manner. More particularly, the component is formed by assembling precut sheets of glass or ceramic dielectric material 61 having conductive metallization areas formed thereon (not shown). Provided along the end walls of the component 25 are metallized termination areas 65 and 67 that subsequent to firing of the structure are intended to facilitate the flow of electric current from the metallized areas formed along the surfaces of the dielectric material 61 to the electric circuits formed on the layers of LTCC dielectric tape.

The metallized termination areas 65 and 67 may be formed using various conventional conductive pastes or inks. Below are examples of two different paste formulations that can be formed using a conventional three mill process.

Silver Conductor Paste—Weight Percent
6% Degussa 3000-1 Silver
Ferro Corporation EG2712 Glass
30% Ferro Corporation V126 Vehicle
Gold Conductor Paste—Weight Percent
6% Degussa 1775 Gold
5% Ferro Corporation EG2712 Glass
19% Ferro Corporation V195 Vehicle Depending on the specific application, one of the above paste formulations may be preferred over the other.

An example of a formulation for a dielectric material that can be used to form the tape necessary to produce the dielectric material layers 61 of the green electronic component 25 is set forth below.

Capacitor Formulation—Weight Percent
7.10% $BaTiO$
0.13% $MnCO_3$
2.00% $H_3BO_3$
12.00% $Bi_2O_3$
34.91% Ferro Corporation EG2773 Glass
3.86% $Bi_2(SnO_3)_3$ As to the particular composition of the glasses, fillers and binders utilized to produce the sheets of dielectric green tape for use in forming the electronic component 25, many alternatives may be selected to satisfy different applications of the invention, such as, for example, the firing time and temperature of the ceramic structure and the co-efficient of expansion of the ceramic materials employed throughout the structure. Care must be taken to utilize a capacitor formulation with a coefficient of expansion similar to that of the LTCC dielectric green tape utilized. The above capacitor formulation is particularly compatible for use with Ferro Corporation's A-6 LTCC dielectric green tape.

The green electronic component 25 is formed in a conventional manner. More particularly, the green dielectric tape for use in forming the electronic component may be made for example by casting a dispersion or slip of the above formulation onto a flexible substrate such as MYLAR, and then heating the cast layer to remove any volatile solvents. Drying the dispersion or slip yields a cast layer comprising the solids portion dispersed in the polymeric material. After drying, the cast layer can then be carefully separated from the flexible substrate. The tape can then be cut to size, printed with the necessary metallization areas (not shown) and then laminated. Lamination is performed, for example, at 2,000 psi, 70° C. for a period of about 10 minutes. Such lamination must be performed with conditions that are less rigorous or severe than those used for the lamination of the stack of LTCC dielectric tape after incorporation of the green electronic component 25. After lamination, the conductive paste can be applied to the outer edges of the laminate to provide the terminations 65 and 67. The green electronic component 25 is then ready for integration into the stack of green LTCC dielectric tape 11.

In addition to using a conventional tape casting method, it will be appreciated that the electronic component 25 may be formed by the conventional technique of screen printing a dielectric formulation, drying the dielectric formulation, and then screen printing metallized areas onto the screen printed dielectric, or by other suitable methods known in the art used to form components such as inductors and multi-layer capacitors. Further, it will be appreciated that as is conventionally done, numerous electronic components can be formed simultaneously, the stacked dielectric and metallized areas being cut into multiple electronic components.

Once the green LTCC dielectric tape 11 has been stacked and cavity 12 has been formed, the green electronic component 25 is inserted into cavity 12. At this point, the stack of green LTCC dielectric tape is ready for lamination. The lamination step removes any gaps or openings in the structure thereby yielding a monolithic green structure.

Lamination conditions must be more severe than the conditions under which the lamination of the green electronic component occurs. Lamination of the green LTCC dielectric tape is performed at a temperature of at least 25° C. and a pressure of at least 1000 psi. More particularly, lamination is preferably performed at about 3,000 psi, at about 70° C. for about 10 minutes. Conventional isostatic lamination is the preferred method so the green stack is placed in a suitable bag which is evacuated and sealed, and then pressed. Lamination ensures that any gaps around the electronic component 25 are removed.

The resulting raw or green monolithic structure is fired or heated to a sintering temperature of from about 800° C. to about 950° C. to fuse the layers or sheets (and to burn off the binder). Subsequent to firing the resulting product is a fired monolithic electronic structure.

It will be appreciated that instead of providing a stack of LTCC green dielectric tape with openings for the green electronic components, one could merely place the green electronic components on top of a layer of LTCC green dielectric tape and then place additional layers of LTCC green dielectric tape on top of the first layer and around the electronic components so as to provide openings that at least partially enclose the green electronic components.

Figure 2:
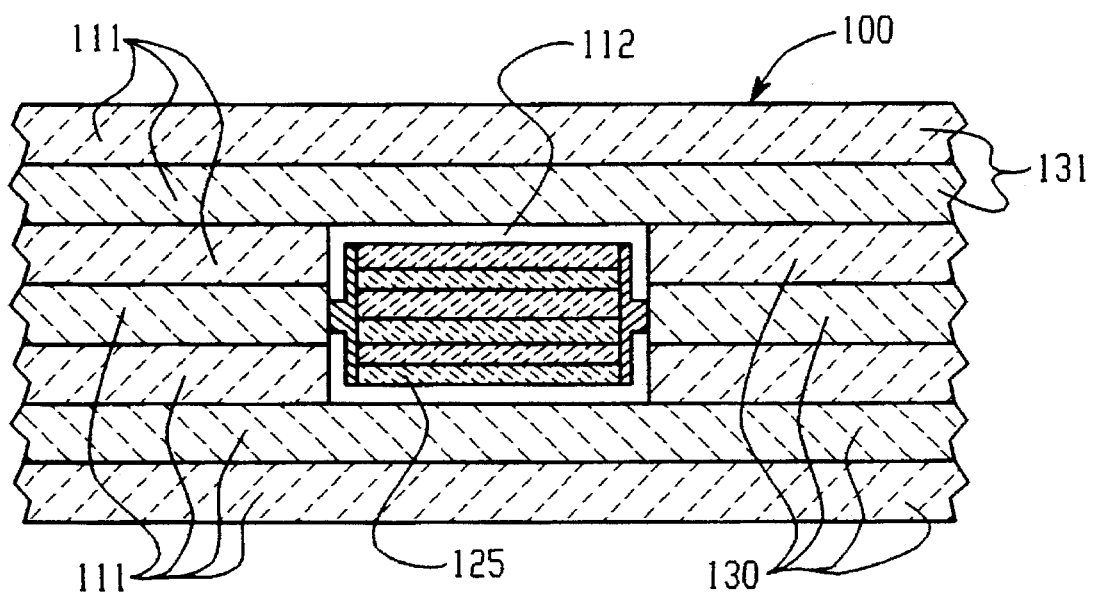
FIG. 2 is a cross-sectional view of another electronic circuit structure prior to lamination having an enclosed cavity with an electronic component located in the cavity produced in accordance with the method of the present invention.

Referring now to FIG. 2 there is illustrated a cross-sectional view of another electronic circuit structure 100 made in accordance with the present invention. Electronic circuit structure 100 is similar to the structure of FIGS. 1 and 1A with the exception that the multiple layers of green LTCC dielectric tape 111 form the fully enclosed cavity 112. Enclosed cavity 112 is formed by first placing the electronic component 125 into an open cavity formed by tape layers 130 and then placing tape layers 131 over the open cavity after the electronic component 125 has been inserted into the open cavity. Once tape layers 131 have been positioned the structure is ready for lamination and firing as described in connection with the embodiment of FIGS. 1 and 1A described above.

It will be appreciated that the orientation of the green electronic device is not limited to the orientation shown in FIGS. 1, 1A and 2. More particularly, the electronic device may be oriented in a vertical or angled orientation instead of the horizontal orientation shown in the figures. Similarly, the openings in the stack of LTCC dielectric tape that house the electronic components may be of various configurations and are not limited to the illustrated square or rectangular-like configurations.

It will be understood that the method of the invention has been shown and described with respect to specific embodiments thereof, and other variations and modifications of the specific method herein shown and described will be apparent to those skilled in the art all within the intended spirit and scope of the invention. Accordingly, the patent is not to be limited in scope and effect to the specific embodiments herein shown and described nor in any other way that is inconsistent with the extent to which the progress in the art has been advanced by the invention.

What is claimed:

1. A method of producing a low temperature cofired monolithic electronic structure having one or more electronic components integrated therein comprising the steps of:

A. forming a green circuit component by a method comprising the steps of:
      i. providing multiple layers of a green dielectric composition;
      ii. forming a metallization pattern on at least one of the layers of green dielectric composition;
      iii. stacking and laminating the metallized layers of green dielectric composition;
   B. providing a stack of green low temperature cofired ceramic dielectric tape having an opening formed in the stack for receiving the green circuit element, at least one layer of said dielectric tape having an unfired metallized circuit path formed along at least one side of such one layer;
   C. placing the green circuit component in the opening in the stack to form a structure; and
   D. laminating the structure at a pressure of at least 1000 psi and a temperature of at least 20° C. and then firing the structure so as to provide the cofired monolithic electronic structure.

2. A method as set forth in claim 1 wherein said green electronic component comprises an unfired electronic component selected from the group consisting of a capacitor, a varistor and an inductor.

3. A method as set forth in claim 1 wherein said method of forming the green electronic component includes the step of:

(iv) applying a conductive termination coating along the outside of at least a portion of the laminated metallized layers of green dielectric composition.

4. A method as set forth in claim 1 including after said step C the step of placing one or more layers of green low temperature cofired ceramic dielectric tape over said opening so as to completely enclose such green electronic component.

5. A method as set forth in claim 1 including the step of applying a conductive termination coating within the opening formed in the stack of green low temperature cofired ceramic dielectric tape, such termination coating subsequent to firing providing a contact for facilitating the flow of electric current from the stack to the electronic component.

6. A method as set forth in claim 1 wherein multiple electronic components are provided and placed in multiple openings formed in the stack of green low temperature cofired ceramic dielectric tape.

7. A method of producing a low temperature cofired structure having one or more electronic components comprising the steps of:

A. providing at least one layer of green low temperature cofired ceramic dielectric tape:
   B. forming a green electronic component by a method comprising the steps of:
      i. providing multiple layers of a green dielectric composition;
      ii. forming a metallization pattern on at least one of the layers of green dielectric composition;

iii. stacking and laminating the metallized layers of green dielectric composition;

C. placing the green electronic component on the layer of green low temperature cofired ceramic dielectric tape;

D. providing additional layers of green low temperature cofired ceramic dielectric tape and placing such additional layers on top of such first layer of green low temperature cofired ceramic dielectric tape so as to provide a structure having an opening that at least partially encloses the green electronic component at least one layer of said layers of green low temperature cofired ceramic dielectric tape having an unfired metallized circuit path formed along at least one side of such one layer; and E. laminating the structure at a pressure of at least 1000 psi and a temperature of at least 20° C. and then firing the structure so as to provide a monolithic cofired electronic structure.

8. A method as set forth in claim 7 wherein multiple electronic components are provided and placed on the first layer of green low temperature cofired ceramic dielectric tape of said step A.

* * * * *